United States Patent [19]

Hyodo

[11] Patent Number: 5,494,764
[45] Date of Patent: Feb. 27, 1996

[54] METHOD FOR MAKING PRINTED CIRCUIT BOARDS

[75] Inventor: Kenji Hyodo, Tokyo, Japan

[73] Assignee: Mitsubishi Paper Mills Limited, Tokyo, Japan

[21] Appl. No.: 391,475

[22] Filed: Feb. 21, 1995

Related U.S. Application Data

[63] Continuation of Ser. No. 36,883, Mar. 25, 1993, abandoned.

[30] Foreign Application Priority Data

Mar. 26, 1992 [JP] Japan .................................. 4-068723
Sep. 24, 1992 [JP] Japan .................................. 4-254527
Jan. 26, 1993 [JP] Japan .................................. 5-011028

[51] Int. Cl.⁶ ...................................................... G03G 13/00
[52] U.S. Cl. ........................ 430/31; 430/97; 430/100; 430/126
[58] Field of Search .................... 430/31, 126, 97, 430/100

[56] References Cited

U.S. PATENT DOCUMENTS

| | | | |
|---|---|---|---|
| 4,063,948 | 12/1977 | Lind | 96/1.6 |
| 4,327,167 | 4/1982 | Tanabe | 430/31 |
| 4,492,747 | 1/1985 | Brechlin | 430/96 |
| 4,548,885 | 10/1985 | Brechlin | 430/49 |
| 4,814,246 | 3/1989 | Lehmann et al. | 430/66 |

FOREIGN PATENT DOCUMENTS

| | | |
|---|---|---|
| 135518 | 7/1989 | Germany . |
| 52-2437 | 1/1977 | Japan . |
| 57-48736 | 3/1982 | Japan . |
| 59-168462 | 9/1984 | Japan . |
| 62-262855 | 11/1987 | Japan . |
| 63-129689 | 6/1988 | Japan . |

*Primary Examiner*—Mark A. Chapman
*Attorney, Agent, or Firm*—Cushman Darby & Cushman

[57] ABSTRACT

Disclosed is a method for making a printed circuit board which comprises providing a photoconductive layer by electrodeposition method on a metal conductive layer provided on at least one side of an electrically insulating substrate, forming a toner image on said photoconductive layer by electrophotographic process, then dissolving and removing the area of the photoconductive layer not covered by the toner using a printer and optionally etching the surface of the area of the substrate from which the photoconductive layer has been removed. According to this method, by employing especially the electrophotographic reversal development, a printed circuit board of excellent sensitivity and high resolution can be produced even from both-side copper-clad laminate sheets having through-holes of a high aspect ratio using an exposure source of low energy such as semiconductor laser.

3 Claims, 1 Drawing Sheet

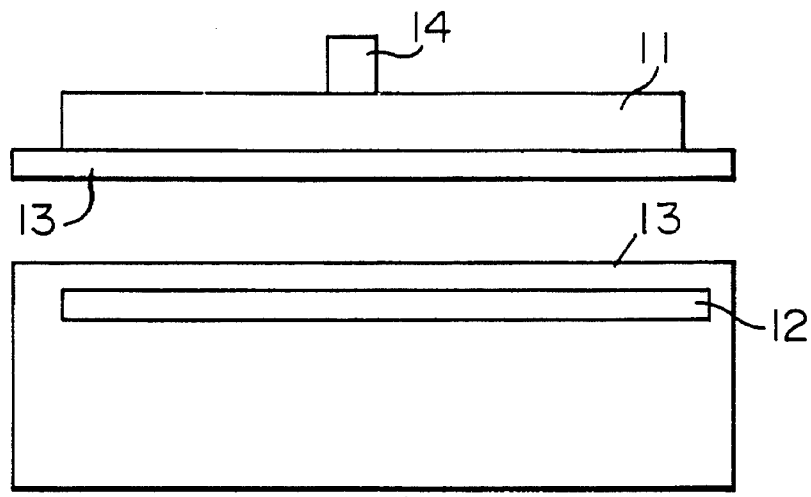
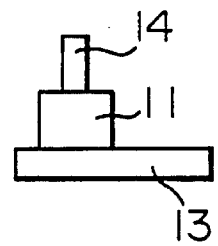
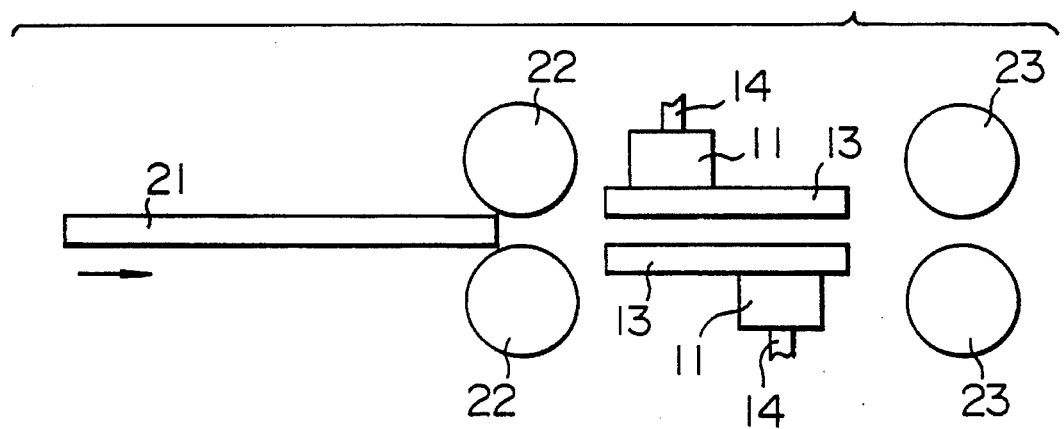

METHOD FOR MAKING PRINTED CIRCUIT BOARDS

This is a continuation of application Ser. No. 08/036,883, filed Mar. 25, 1993 now abandoned.

BACKGROUND OF THE INVENTION

The present invention relates to a method for making a printed circuit board using the electrophotographic process and more particularly to a novel method for making a printed circuit board which comprises forming by the electrophotographic process a toner image on a photoconductive layer provided on a substrate for circuit boards by an electrodeposition method and a method for making a printed circuit board in which a toner layer is also formed in the fine through-holes prior to a stripper treatment.

Hitherto, printed circuit boards have been generally produced in the following manner. That is, a photosensitive film is laminated on a laminate sheet comprising an insulating substrate clad with a copper foil, and a photographic negative is put on the photosensitive film. The photosensitive film is exposed through the negative and developed. Then, the undesired copper foil other than the circuit pattern is removed by etching treatment and thereafter, the photosensitive film is removed to form a printed circuit on the insulating substrate. According to this method which uses a photosensitive film, since the photosensitive film is generally thick, namely, about 50 μm, the circuit pattern formed by exposure and development is not sharp and furthermore, it is difficult to uniformly laminate the photosensitive film on the surface of the copper foil and especially it is almost impossible to cover the inside of through-holes.

In an attempt to improve the resolution of the photosensitive film, forming a photosensitive resist on a substrate by electrodeposition method has been proposed in Japanese Patent Kokai (Laid-Open) Nos. 62-262855 and 64-4672. The electrodeposition method can form a uniform thin photosensitive layer as compared with the laminating method. However, photoresists for electrodeposition are generally low in sensitivity. Accordingly, in the case of so-called positive type in which the exposed portions are solubilized in the treating solution, as much as several hundred mJ/cm$^2$ of energy is required for obtaining a sufficient dissolution and thus, the electrodeposition method is not suitable for carrying out the exposure by a laser. Furthermore, it is difficult to expose the inside of the through-holes to light.

On the other hand, as a method for making printed circuit boards other than the photosensitive resist method, utilization of the electrophotographic process is proposed in West German Patent Nos. 1,117,391, 2,526,720 and 3,210,577 and Japanese Patent Kokai (Laid-Open) Nos. 52-2437, 57-48736 and 59-168462. Japanese Patent Kokai (Laid-Open) No. 63-129689 discloses a method for making printed circuit boards using an electrophotographic photoreceptor having a sensitivity to the wavelength of lasers. This direct patterning of circuits using the electrophotographic process requires a small quantity of exposure of 50-1 μJ/cm$^2$ and semiconductor lasers of low cost and low output can be used. However, the photoconductive layer is provided by coating on a conductive substrate a dispersion or solution of a photoconductive compound and a suitable insulating resin in an organic solvent or by transferring the photoconductive layer once coated on an interim substrate to a conductive substrate by application of heat and pressure. Therefore, the photoconductive layer cannot be uniformly provided in the through-holes.

SUMMARY OF THE INVENTION

The object of the present invention is to provide a method for making a printed circuit board which can provide an excellent image reproducibility and can perform uniform treatment of the inside of through-holes and which takes the advantage of high sensitivity of electrophotography. In more detail, the object of the present invention is to provide a method for making a printed circuit board by which a photoconductive layer can also be uniformly provided in the through-holes.

As a result of intensive research conducted by the inventors, they have found a method for making a printed circuit board which comprises forming by an electrodeposition process a photoconductive layer on a metal conductive layer provided on at least one side of an electrically insulating substrate, forming a toner image on the photoconductive layer by the electrophotographic process, then dissolving and removing the area of the photoconductive layer not covered by the toner and optionally etching the surface of the area of the substrate from which the photoconductive layer has been removed. Thus, the present invention has been accomplished.

That is, according to the present invention, printed circuit boards are produced in the following manner. A compound having photoconductivity and an electrodeposition resin are electrodoposited by an electrodeposition method using a metal conductive substrate for printed circuit boards as an electrode to form a photoconductive layer on the conductive substrate and/or in through-holes. Then, a toner image is formed on the photoconductive layer by the electrophotographic process and the photoconductive layer of the non-image area other than the toner image area is dissolved and removed by a stripper and if necessary, the metal conductive layer of the non-image area is subjected to an etching treatment. Thus, a printed circuit board is obtained.

As a method for making printed circuit boards without carrying out the etching treatment of the metal conductive layer of the non-image area from which the photoconductive layer has been removed, so-called semi-additive method (Text for "PWB Production", page 29, Fundamental Education Course of Printed Circuit Society) can be applied. According to this method, after the photoconductive layer has been removed, the surface of the metal conductive layer of the non-image area from which the photoconductive layer has been removed is subjected to an electric plating and then, the toner image area comprising the toner and the photoconductive layer is removed and furthermore, the metal conductive layer exposed after the toner image area has been removed is subjected to a quick etching treatment, whereby a conductive pattern can be formed.

The electrodeposition method is one of coating methods which has been employed since more than 20 years ago and has already been put to practical use for coating of automobile bodies or coating of photoresist for a part of printed circuit boards. This method has the features that superior affinity to the substrates can be obtained and thickness of the coat can be made uniform irrespective of the surface configuration of the substrates. In general, this method is carried out by dipping an electrode in an aqueous dispersion of a cationic or anionic resin and flowing a current therethrough to migrate the ionic species onto the surface of the electrode to cause a chemical reaction to take place on the surface of the electrode and to cause loss of the ionic properties, whereby the resin is water-insolubilized.

BRIEF DESCRIPTION OF THE DRAWINGS

FIG. 1 shows a front view of the construction of a developing electrode used in the present invention.

FIG. 2 shows a bottom view of the construction of a developing electrode used in the present invention.

FIG. 3 shows a side view of the construction of a developing electrode used in the present invention.

FIG. 4 is a side view of a developing apparatus used in the present invention.

In FIGS. 1–4, 11 indicates a toner rectifying chamber, 12 a slit for discharging the toner, 13 a developing electrode, 14 a toner feeding pipe, 21 a laminate sheet clad with copper on both sides on which an electrostatic latent image has been formed, 22 an inlet squeeze roll, and 23 an outlet squeeze roll.

DESCRIPTION OF THE INVENTION

The resins used for electrodeposition in the present invention must be those which can be formed into a water-insoluble resin layer on a substrate for printed circuit boards by usual electrodeposition method using the substrate as an electrode, satisfy the electrophotographic characteristics including chargeability and have a proper solubility with strippers. Especially when the surface of the substrate (copper layer) exposed after removal of the photoconductive layer is subjected to an acidic etching treatment, resins having anionic functional group can be advantageously used for obtaining etching resistance. If the resin layer formed is high in the proportion of anionic monomers, the resin layer redissolves in water with ease and the resin film becomes fragile. Besides, ionic conductivity increases to deteriorate the electrophotographic characteristics such as chargeability in the dark. Therefore, the composition of the electrodeposition resin used in the present invention is suitably adjusted by copolymerizing an anionic monomer with a nonionic monomer.

Among the resins having an anionic functional group, copolymers containing monomers having carboxylic group and phenolic resins have a high charge retainability and can be advantageously used. As the copolymers containing monomers having carboxyl group, preferred are copolymers of styrene and a maleic monoester and binary or higher copolymers of acrylic acid or methacrylic acid and alkyl esters, aryl esters or aralkyl esters thereof. Furthermore, copolymers of vinyl acetate and crotonic acid are also useful. Especially preferred phenolic resins are novolak resins prepared by condensation of phenol, o-cresol, m-cresol or p-cresol with formaldehyde or acetaldehyde under acidic conditions.

Typical examples of the electrodeposition resins used in the present invention are copolymers of styrene, acrylic ester, methacrylic ester, vinyl acetate, vinyl benzoate or the like with a carboxylic acid-containing monomer such as acrylic acid, methacrylic acid, itaconic acid, crotonic acid, maleic acid, fumaric acid or the like such as styrene/maleic acid monoalkyl ester copolymers, methacrylic acid/methacrylic ester copolymers, styrene/methacrylic acid/methacrylic ester copolymers, acrylic acid/methacrylic ester copolymers, styrene/acrylic acid/methacrylic ester copolymer, vinyl acetate/crotonic acid copolymers and vinyl acetate/crotonic acid/methacrylic ester copolymers, methacrylamide, copolymers containing monomers having phenolic hydroxyl group, sulfonic acid group, sulfonamide group, sulfonimide group or phosphonic acid group, phenolic resins and xylene resins. These resins may be used each alone or as a mixture of two or more.

For carrying out the electrodeposition, it is necessary that at least the above electrodeposition resin is uniformly dispersed or more preferably dissolved in the electrodeposition solution. For this purpose, it is preferred to neutralize a part or all of the anionic groups in the above resins with an organic or inorganic base. The inorganic base includes, for example, sodium carbonate, sodium hydroxide, potassium hydroxide and ammonia. The organic base includes, for example, triethylamine and ethanolamine.

Organic or inorganic photoconductive materials can be used as the photoconductive materials used in the photoconductive layer. The inorganic photoconductive materials include, for example, cadmium sulfide, zinc oxide and titanium oxide. The organic photoconductive materials include, for example, metal-free or metal (oxide) phthalocyanines and naphthalocyanines and derivatives thereof. Furthermore, perinone compounds, oxadiazole compounds, anthanthrone compounds, sensitizing dyes or the like may be optionally used in combination with the abovementioned materials.

The electrodeposition solution used for the electrodeposition according to the present invention comprises a mixture of the above-mentioned photoconductive compound and the above-mentioned resin with water. An organic solvent or a mixture of an organic solvent with water may be used in place of water. The resin component and the photoconductive compound may be in the state of being dispersed or partially dissolved in water or the organic solvent. The amount of the photoconductive compound on the basis of the amount of the resin may vary depending on the resin composition, but preferably is in the range of from about 0.1 part by weight to about 40 parts by weight. Furthermore, the solid concentration of the electrodeposition solution is preferably kept at constant in the range of from 1% by weight to 30% by weight for easy control of the film thickness depending on the quantity of current.

As the conductive substrates comprising an electrically insulating substrate and a metal conductive layer provided thereon, there may be used copper foil-clad laminate sheets which are impregnated with phenolic resins, epoxy resins or the like as mentioned in "Handbook of Printed Circuit Technique" (edited by Japan Printed Circuit Industrial Association and published from Nikkan Kogyo Shinbun Co. in 1987).

If the photoconductive layer is too thin, it cannot be charged in such a degree as required for development with toner and if it is too thick, not only the deterioration of the stripper is accelerated, but also thinning of line images is brought about when the photoconductive layer of the non-image area is removed and images high in reproducibility cannot be obtained. Therefore, it is desired to set the electrodeposition conditions so as to adjust the thickness to 0.50–10 μm.

The copper foils used in the present invention can have various thicknesses, but generally those which have a thickness of 35 μm to 5 μm are used, though those which have a thickness larger or smaller than said range can also be used. With increase in wiring density and decrease in the line width of the conductor, the thinner copper foils are preferred.

The electrodeposition is carried out basically by placing a conductive substrate for printed circuit boards and a counter electrode of a suitable metal in a solution containing the above-mentioned electrodeposition resin and the above-mentioned photoconductive compound and applying a suitable potential between the conductive substrate and the counter electrode.

As the toner for forming images, the wet toner used for making electrophotographic printing plate can be used, but it must have resistance against removal of the photoconductive layer of the non-image area and etching of the conductive layer exposed by the removal of the photoconductive layer of the non-image area which are the subsequent steps. Furthermore, it is necessary that the toner is charged positively or negatively depending on the photoconductive compound used, the chargeability in corona charging and the developing process.

The toner development is carried out by contacting the charged and developed photoreceptor with a toner dispersion in the same manner as in the development of the general electrophotographic printing plates. The developing process can be roughly classified into the normal development which uses a toner having the charge of the polarity opposite to that of the electrostatic latent image and the reversal development which uses a toner having the charge of the same polarity as of the electrostatic latent image. In the case of making printed circuit boards having through-holes, when the thickness of the substrate is larger than the diameter of the through-holes, namely, so-called aspect ratio of the diameter of the through-holes and the thickness is high, it is difficult to form an electrostatic latent image inside the through-holes. In such a case, the potential of the electrostatic latent image formed in the through-holes cannot be increased so much and in the case of the normal development which uses a toner having the charge of the opposite polarity to that of the electrostatic latent image, it is difficult to form a uniform toner layer in the through-holes. Thus, it is necessary to employ so-called reversal development which uses a toner having the charge of the same polarity as of the electrostatic latent image. Furthermore, in the case of the copper-clad laminate sheet having through-holes of a high aspect ratio, the copper layer inside the through-holes can also be surely protected by employing the reversal development process.

As aforementioned, laser beam sources can be used for exposing the photoconductive layer formed. The laser beam sources used depends on the kinds of the photoconductive compounds used. For example, a semiconductor laser can be used in the case of using χ-type phthalocyanines and an argon laser can be used in the case of using ε-type copper phthalocyanine and anthanthrone compounds having a spectral absorption at about 500 nm.

As the strippers used for removing the area of the photoconductive layer on which no toner images are formed after the toner development, there may be basically used the developing apparatuses for PS plates which use alkaline developers.

The etching is a step for removing the copper foil exposed as a result of the removal of the photoconductive layer by the stripper, and apparatuses as disclosed in the "Handbook of Printed Circuit Technique" (edited by Japan Printed Circuit Industrial Association and published from Nikkan Kogyo Shinbun Co. in 1987) referred to hereabove can be used. Furthermore, there may be used any etching solutions which can dissolve and remove the copper foil. General etching solutions for making printed circuit boards can be used.

By carrying out the etching step, basically the pattern of copper foil necessary for the circuit can be obtained, but the photoconductive layer and the toner are present in the unetched area. These may be present as they are, but in some case becomes unnecessary at the time of connection of circuit components, chips and others. In this case, these can be removed by the treatment with a solution of the higher alkalinity as in making printed circuit boards utilizing the general photosensitive polymers. If necessary, organic solvents such as methyl ethyl ketone and dioxane can also be used.

In the electrodeposition step, the same apparatuses as used for the normal electrodeposition coating can be used and the photoconductive layer can be formed by placing the substrate electrode on which an electrodeposition layer is to be formed and a counter electrode for applying electricity in the electrodeposition solution and passing a direct current between the electrodes. The thus formed photoconductive layer is generally porous as it is, but becomes a uniform layer upon being dried by heating to fill the pores. Furthermore, a stable chargeability in the dark can be imparted by this drying step.

The invention is illustrated by the following examples, but they should not be construed as limiting the invention in any manner.

EXAMPLE 1

Preparation of Resin for Electrodeposition

A mixture comprising 40 parts by weight of methyl methacrylate, 40 parts by weight of butyl acrylate, 20 parts by weight of acrylic acid and 2 parts by weight of azobisiosbutyronitrile was added dropwise to 90 parts by weight of dioxane kept at 100° C. in a nitrogen gas atmosphere over a period of 3 hours and the mixture was kept for further 5 hours to obtain an acrylic resin solution.

Electrodeposition

To 50 parts by weight of the resin solution obtained above was added 10 parts by weight of ε-type copper phthalocyanine (RIOPHOTON ERPC manufactured by Toyo Ink Co., Ltd.) and then triethylamine was added to the solution to neutralize it. Thereafter, deionized water was added to the solution so that it had a solid content of 10% by weight. Thus, an electrodeposition bath was obtained. Electrodeposition was carried out using this electrodeposition bath and a both-side copper-clad laminate sheet for printed circuit boards (50×1000×1.0 mm; thickness of copper foil: 5 μm) having many through-holes of 0.6 mm in diameter as a positive electrode at a bath temperature of 25° C. by passing a direct current of 120 V for 1 minute. The deposited film was washed with water and dried at 70° C. for 10 minutes to obtain a copper-clad laminate sheet having a smooth photoconductive layer of about 5 μm thick. The resulting photoconductive layer was superior in adhesion to the surface of copper and furthermore, uniformly coated even when the surface of copper had irregularities such as flaws. Examination of the section of the sheet by a microscope showed that the photoconductive layer was uniformly formed also on the inner wall of the through-holes.

Evaluation of Photoconductivity

The photoconductive characteristics of the resulting copper-clad laminate sheet were evaluated by an electrostatic field measuring apparatus SP-428 manufactured by Kawaguchi Electric Mfg. Co., Ltd. When a corona voltage of −6.0 KV was applied, $V_0$ (initial potential) was −300 V and $DD_{10}$ (dark decay retention after 10 seconds) was 89%. The surface of the charged photoconductive layer was exposed to light of 633 nm and 780 nm and the sensitivity of the photoconductive layer was measured. Exposure $E_{1/10}$ (μJ/cm$^2$) required for reducing the surface potential after exposure to 1/10 of the initial potential under an exposure intensity of 10 mW/cm$^2$ was measured to obtain 2.45 for the light of 633 nm and 2.13 for the light of 780 nm. These results show that the copper-clad laminate sheet had an extremely excellent photoconductivity.

Formation of Toner Images

The both-side copper-clad laminate sheet on which the photoconductive layer was formed was charged to −350 V. Then, on both sides of this laminate sheet were formed electrostatic latent images of 40 µm in line width by a laser plotter with a wavelength of 780 nm in such a manner that the through-hole portions were not exposed. The resulting latent images were subjected to dipping development with a liquid developer LOM-EDIII for Dia Fax Master (manufactured by Mitsubishi Paper Mills Ltd.) and the toner images were fixed by a toner fixing machine EP-31V (manufactured by Mitsubishi Paper Mills Ltd.). Examination of the section of the sheet showed that the toner was uniformly fixed also inside the through-holes.

Removal of the Photoconductive Layer of Non-Image Area

The areas of the photoconductive layer not covered by the toner were removed by an aqueous alkali solution prepared by diluting twelvefold an alkaline developer "Decoating Solution 872" manufactured by Polychrome Co. (U.S.A.) with water to form wiring line images comprising the toner image and the undissolved photoconductive layer under the toner image.

Etching

Using as an etching resist the above wiring images comprising the toner and the undissolved photoconductive layer formed on the conductive substrate by the aqueous alkali solution, the substrate was sprayed with a ferric chloride etching solution of 42° Baume heated to 35° C. at a spray pressure of 2.5 kg/cm$^2$ for 1 minute to carry out etching of the metal conductive layer not covered with the etching resist. Thereafter, the etching resist comprising the toner and the photoconductive layer was removed with methyl ethyl ketone to form a copper circuit of about 40 µm in line width in the area of the etching resist. Observation by a microscope showed that a uniform copper layer was present also on the inner wall of the through-holes.

EXAMPLE 2

Preparation of Resin for Electrodeposition

An acrylic resin solution for electrodeposition was prepared in the same manner as in Example 1.

Electrodeposition

To 50 parts by weight of the resin solution obtained above was added 10 parts by weight of χ-type metal-free phthalocyanine (Fastogen Blue #8120 manufactured by Dainippon Ink & Chemicals Inc.) and then triethylamine was added to the solution to neutralize it. Thereafter, deionized water was added to the solution so that it had a solid content of 10% by weight. Thus, an electrodeposition bath was obtained. Electrodeposition was carried out using this electrodeposition bath and a both-side copper-clad laminate sheet for printed circuit boards (50×1000×2.0 mm; thickness of copper foil: 5 µm) having many through-holes of 0.6 mm and 1.2 mm in diameter as a positive electrode at a bath temperature of 25° C. by passing a direct current of 120 V for 1 minute. The deposited film was washed with water and dried at 70° C. for 10 minutes to obtain a copper-clad laminate sheet having a smooth photoconductive layer of about 5 µm thick.

Evaluation of the Photoconductive Layer

The resulting photoconductive layer was superior in adhesion to the surface of copper and furthermore, uniformly coated even when the surface of copper had irregularities such as flaws. Examination of the section of the sheet by a microscope showed that the photoconductive layer was uniformly formed also on the inner wall of the through-holes. The photoconductive characteristics of the resulting copper-clad laminate sheet were evaluated by an electrostatic field measuring apparatus SP-428 manufactured by Kawaguchi Electric Mfg. Co., Ltd. When a corona voltage of +6.0 KV was applied, $V_0$ (initial potential) was +300 V and $DD_{10}$ (dark decay retention after 10 seconds) was 91%.

Formation of Toner Images

The above both-side copper-clad laminate sheet on which the photoconductive layer was formed was charged to +250 V. Then, on both sides of this laminate sheet were formed electrostatic latent images of 40 µm in line width by a laser plotter with a wavelength of 780 nm. The resulting latent images on one side were subjected to reversal development with a positively charged liquid developer LOM-EDIII for Dia Fax Master (manufactured by Mitsubishi Paper Mills Ltd.) and then the latent images on another side were similarly subjected to the reversal development. The resulting toner images were fixed by a toner fixing machine EP-31V (manufactured by Mitsubishi Paper Mills Ltd.). Examination of the section of the sheet showed that the toner was uniformly developed and fixed also inside the through-holes of both 0.6 mm and 1.2 mm in diameter.

Removal of the Photoconductive Layer of Non-Image Area

Wiring line images comprising the toner image and the undissolved photoconductive layer under the toner image were formed in the same manner as in Example 1.

Etching

Etching of the metal conductive layer not covered with the etching resist was carried out in the same manner as in Example 1. Thereafter, the etching resist comprising the toner and the photoconductive layer was removed with methyl ethyl ketone to form a copper circuit of about 40 µm in line width in the area of the etching resist. Observation by a microscope showed that a uniform copper layer was present also on the inner wall of the through-holes.

Example 3

Preparation of Resin for Electrodeposition

An acrylic resin solution for electrodeposition was prepared in the same manner as in Example 1.

Electrodeposition

An electrodeposition bath was obtained in the same manner as in Example 2. Electrodeposition was carried out using this electrodeposition bath and a both-side copper-clad laminate sheet for printed circuit boards (300×300×1.6 mm; thickness of copper foil: 18 µm) having many through-holes of 0.6 mm and 1.2 mm in diameter as a positive electrode at a bath temperature of 25° C. by passing a direct current of 120 V for 1 minute. The deposited film was washed with water and dried at 70° C. for 10 minutes to obtain a copper-clad laminate sheet having a smooth photoconductive layer of about 5 µm thick on both sides.

Evaluation of the Photoconductive Layer

The resulting photoconductive layer was superior in adhesion to the surface of copper and furthermore, uniformly coated even when the surface of copper had irregularities such as flaws. Examination of the section of the sheet by a microscope showed that the photoconductive layer was uniformly formed also on the inner wall of the through-holes. The photoconductive characteristics of the resulting copper-clad laminate sheet were evaluated by an electrostatic field measuring apparatus SP-428 manufactured by Kawaguchi Electric Mfg. Co., Ltd. When a corona voltage of +6.0 KV was applied, $V_0$ (initial potential) was +300 V and $DD_{10}$ (dark decay retention after 10 seconds) was 91%.

Formation of Toner Images

The above both-side copper-clad laminate sheet on which the photoconductive layer was formed was charged to +250 V in the dark. Then, on both sides of this laminate sheet were formed electrostatic latent images of 40 μm in line width by a laser plotter with a wavelength of 780 nm. The resulting latent images were subjected to reversal development in the following manner using the developing electrode as shown in FIG. 1–3 and using the developing apparatus in which the reversal developing electrodes were provided on both sides of the substrate as shown in FIG. 4. That is, the copper of the both-side copper-clad laminate sheet 21 was grounded and the latent images thereon were subjected to reversal development by transferring the sheet in the direction of the arrow with applying a developing bias of +120 V to the two developing electrodes 13 and simultaneously feeding a positively charged liquid developer from the toner feeding pipe 14 and discharging the developer from toner discharging slit 12. As the developer, toner ODP-TW for Mitsubishi OPC printing system (manufactured by Mitsubishi Paper Mills Ltd.) was used. After the toner development, the substrate was put in a hot-air dryer of 90° C. for 3 minutes to fix the toner images. As a result of examination on the generation of defects at the section and around the through-holes, it was confirmed that the toner was uniformly fixed also inside and around the through-holes for 50 through-holes of 0.6 mm and 1.2 mm in diameter.

Removal of the Photoconductive Layer of Non-Image Area

Wiring line images comprising the toner image and the undissolved photoconductive layer under the toner image were formed by removing the areas of the photoconductive layer not covered with the toner using a decoating solution ODP-DF II for Mitsubishi OPC printing system.

Etching

Etching of the metal conductive layer not covered with the etching resist was carried out in the same manner as in Example 1. Thereafter, the etching resist comprising the toner and the photoconductive layer was removed with methyl ethyl ketone to form a copper circuit of about 40 μm in line width in the area of the etching resist on both sides. Observation by a microscope showed that a uniform copper layer was present on the inner wall of the through-holes and around the through-holes for fifty through-holes of 0.6 mm and 1.2 mm in diameter.

According to the reversal developing method, a toner layer can be uniformly formed inside the through-holes having a high aspect ratio of the copper-clad laminate sheet and the copper layer in the through-holes can be surely protected.

In carrying out the reversal development, developing electrodes are provided on both sides of the substrate and toner images are simultaneously formed on the photoconductive layers on both sides of the substrate, whereby a toner layer can be uniformly formed inside the through-holes having a high aspect ratio of the copper-clad laminate sheet and the copper layer in the through-holes can be more surely protected.

What is claimed is:

1. A method for making a printed circuit board which comprises the following steps:

providing a metal conductive layer on both sides of an electrically insulating substrate having through-holes and on the inner wall of the through-holes to obtain an electrically conductive substrate;

providing a photoconductive layer by electrodeposition method on said metal conductive layer;

forming a toner image on said photoconductive layer by electrophotographic reversal development method;

decoating a portion of the photoconductive layer other than the toner image portion; and etching the metal conductive layer exposed after decoating of the photoconductive layer.

2. A method for making a printed circuit board according to claim 1, wherein the photoconductive layer is provided by the electrodeposition method using an electrodeposition solution containing a resin having an anionic functional group and a base which neutralizes the anionic functional group.

3. A method for making a printed circuit board according to claim 2, wherein the anionic functional group is a carboxylic acid group and the base which neutralizes the anionic functional group is an organic base.

* * * * *